(12) United States Patent
Yoshida et al.

(10) Patent No.: US 12,245,513 B2
(45) Date of Patent: Mar. 4, 2025

(54) SOUND PRESSURE-ELECTRICAL SIGNAL CONVERSION DEVICE AND CONVERSION METHOD FOR SAME

(71) Applicant: National Institute of Advanced Industrial Science and Technology, Tokyo (JP)

(72) Inventors: Manabu Yoshida, Tsukuba (JP); Naoki Shirakawa, Tsukuba (JP); Nobuko Fukuda, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 489 days.

(21) Appl. No.: 17/625,997

(22) PCT Filed: Jun. 12, 2020

(86) PCT No.: PCT/JP2020/023282
§ 371 (c)(1),
(2) Date: Jan. 10, 2022

(87) PCT Pub. No.: WO2021/010072
PCT Pub. Date: Jan. 21, 2021

(65) Prior Publication Data
US 2022/0278267 A1 Sep. 1, 2022

(30) Foreign Application Priority Data
Jul. 12, 2019 (JP) .................... 2019-130123

(51) Int. Cl.
*H10N 30/87* (2023.01)
*H04R 17/00* (2006.01)
(Continued)

(52) U.S. Cl.
CPC ........... *H10N 30/87* (2023.02); *H04R 17/005* (2013.01); *H04R 19/016* (2013.01); *H10N 30/30* (2023.02); *H10N 30/704* (2024.05)

(58) Field of Classification Search
None
See application file for complete search history.

(56) References Cited

U.S. PATENT DOCUMENTS 3,646,280 A * 2/1972 Tamura ................ H04R 19/013
381/191
8,300,858 B2 * 10/2012 Nakaya .................. H04R 19/02
381/189
(Continued)

FOREIGN PATENT DOCUMENTS

| JP | 2009-284397 A | 12/2009 |
| JP | 2012-182684 A | 9/2012 |
| JP | 2019-068414 A | 4/2019 |

OTHER PUBLICATIONS

International Search Report issued in corresponding International Application No. PCT/JP2020/023282, dated Sep. 8, 2020 (2 pages).
(Continued)

*Primary Examiner* — Forrest M Phillips
*Assistant Examiner* — Joseph James Peter Illicete
(74) *Attorney, Agent, or Firm* — Osha Bergman Watanabe & Burton LLP

(57) ABSTRACT

Provided is a sheet-shape electrostatic sound pressure-electrical signal conversion device that is three-dimensionally deformable and has a low drive voltage.

The sound pressure-electrical signal conversion device includes a polymer sheet sandwiched between a pair of electrodes facing each other, the polymer sheet is a dielectric film, at least one of the electrodes includes an insulating flexible substrate having a plurality of through-holes and a plurality of conductive fibers having one end fixed to the flexible substrate with a pressure sensitive adhesive, electrical conduction in an in-plane direction is formed by contact between the conductive fibers, the conductive fibers are vibrated by giving an electrical signal to the pair of electrodes or the conductive fibers are vibrated by receiving sound pressure to cause the pair of electrodes to output an electrical signal.

12 Claims, 8 Drawing Sheets

(51) Int. Cl.
    *H04R 19/01*    (2006.01)
    *H10N 30/00*    (2023.01)
    *H10N 30/30*    (2023.01)

(56) References Cited

U.S. PATENT DOCUMENTS

| | | | | |
|---|---|---|---|---|
| 8,600,082 | B2* | 12/2013 | Lee | H04R 17/005 |
| | | | | 381/191 |
| 10,147,868 | B2* | 12/2018 | Ozawa | H04R 17/005 |
| 11,750,981 | B2* | 9/2023 | Nakano | B62D 1/065 |
| | | | | 29/25.35 |
| 11,910,159 | B2* | 2/2024 | Miyoshi | B32B 27/36 |
| 2009/0016551 | A1 | 1/2009 | Chiang et al. | |
| 2009/0304212 | A1* | 12/2009 | Han | H04R 31/00 |
| | | | | 381/191 |
| 2020/0053482 | A1 | 2/2020 | Nakano et al. | |

OTHER PUBLICATIONS

Written Opinion of the International Searching Authority issued in corresponding International Application No. PCT/JP2020/023282, dated Sep. 8, 2020 (4 pages).
International Preliminary Report on Patentability issued in corresponding International Appliation No. PCT/JP2020/023282; mailed Jan. 27, 2022(6 pages).

\* cited by examiner (a)

(b)

SOUND PRESSURE-ELECTRICAL SIGNAL CONVERSION DEVICE AND CONVERSION METHOD FOR SAME

TECHNICAL FIELD

The present invention relates to an electrostatic sound pressure-electrical signal conversion device capable of mutually converting between sound pressure of a speaker, a microphone, or the like and an electrical signal, and a conversion method thereof, and the present invention particularly relates to a sheet-shape electrostatic sound pressure-electrical signal conversion device that is three-dimensionally deformable and a conversion method of the same.

BACKGROUND ART

There are known sound pressure-electrical signal conversion devices such as microphones that convert sound pressure (sound) into an electrical signal and conversely, speakers that convert an electrical signal into sound pressure. The microphone and the speaker have a substantially common basic structure and generally perform signal conversion by electromagnetic induction using an electromagnet. (Note that since the structures are common, only one of the speaker and the microphone will be described below.) Meanwhile, an electrostatic type (capacitor type) speaker that forms sound pressure in a space using electrostatic force (Coulomb force) has also been proposed. When a predetermined bias voltage is applied to a conductive diaphragm inserted between two electrodes facing each other at an interval and a voltage between the electrodes is changed, a vibrating body is vibrated by a change in electrostatic force acting on the vibrating body to form sound pressure in the space.

For example, Patent Document 1 discloses an electrostatic speaker using an electrode that is like a woven fabric formed of conductive fibers and has through-holes. A vibrating body having a thickness of about several μm to several tens μm obtained by depositing a metal film on a polymer resin film made of polyethylene terephthalate, polypropylene, or the like or by applying a conductive coating material to the polymer resin film is sandwiched between a pair of cloth electrodes with a separator having an insulating property, elasticity, and acoustic permeability interposed therebetween. Since the cloth electrode has through-holes, sound pressure from the vibrating body is favorably released to the outside.

In the electrostatic speaker as described above, the bias voltage is necessary, and a drive voltage becomes high because the vibrating body is driven via the insulating separator.

Meanwhile, Patent Literature 2 discloses an electrostatic speaker including a conductive acoustic transmissive planar electrode arranged to face a vibrating membrane made of a thin-film member and a buffer member that is arranged between the vibrating membrane and the planar electrode and includes at least a part facing the vibrating membrane being formed while including a material separated from the vibrating membrane on triboelectric series. The vibrating membrane is triboelectrically charged by vibration, an amount of electric charges increases further, and an effect similar to that in the case of applying high potential is obtained, so that an applied voltage necessary for forming sound pressure can be further reduced.

CITATION LIST

Patent Literature

Patent Literature 1: JP 2009-284397 A
Patent Literature 2: JP 2012-182684 A

SUMMARY OF INVENTION

Technical Problem

In an electrostatic type sound pressure-electrical signal conversion device, it is necessary to ensure insulation between a diaphragm and electrodes sandwiching the diaphragm, and as a result, a drive voltage becomes high. In particular, in the case of a sheet-shape electrostatic type sound pressure-electrical signal conversion device that is three-dimensionally deformable, it is necessary to ensure sufficient insulation even against deformation.

The present invention has been made in view of circumstances as described above, and an object of the present invention is to provide a sheet-shape electrostatic sound pressure-electrical signal conversion device that is three-dimensionally deformable and has a low drive voltage and a conversion method of the same.

Solution to Problem

A sound pressure-electrical signal conversion device according to the present invention is a sound pressure-electrical signal conversion device including a polymer sheet sandwiched between a pair of electrodes facing each other, in which the polymer sheet is a dielectric film, at least one of the electrodes includes an insulating flexible substrate having a plurality of through-holes and a plurality of conductive fibers having one end fixed to the flexible substrate, electrical conduction in an in-plane direction is formed by contact between the conductive fibers, and the conductive fibers are vibrated by giving an electrical signal to the pair of electrodes to generate sound pressure or the conductive fibers are vibrated by receiving sound pressure to cause the pair of electrodes to output an electrical signal.

According to the invention, since the electrodes can be provided to the insulating dielectric film without interposing an insulating layer, and thickness can be reduced, three-dimensional deformation can be facilitated and the drive voltage can be further reduced.

In the invention described above, even if deformation is made, frequency characteristics are not substantially changed. According to the invention, since the electrodes are responsible for formation of sound pressure or conversion into an electrical signal, there is no change in the frequency characteristics due to deformation, and operational stability is excellent even against three-dimensional deformation.

In the invention described above, the dielectric film is a piezoelectric conversion film. According to the invention, it is not necessary to provide a bias voltage, and the drive voltage can be reduced.

In the invention described above, the conductive fibers are provided to one main surface of the flexible substrate and positioned to face the polymer sheet. According to the invention, the drive voltage can be further reduced.

In the invention described above, the flexible substrate has stretchability. Additionally, the flexible substrate includes a woven fabric, a fiber mesh, paper provided with the through-holes, or a resin sheet provided with the through-holes. According to the invention, since operational stability against three-dimensional deformation is excellent, the invention can be applied to various applications.

In the invention described above, the conductive fibers are fibers in which a conductive film is provided on a surface of a needle-shaped body whose rigidity is controlled. According to the invention, it is possible to easily obtain an electrostatic type sound pressure-electrical signal conversion device suitable for an application.

The invention described above, the conductive fibers have an average length shorter than an average opening width of the through-holes. According to the invention, operational stability is excellent even against three-dimensional deformation.

Additionally, a conversion method according to the present invention is a sound pressure-electrical signal conversion method using a sound pressure-electrical signal conversion device including a polymer sheet sandwiched between a pair of electrodes facing each other, in which the polymer sheet is a dielectric film, at least one of the electrodes includes an insulating flexible substrate having a plurality of through-holes and a plurality of conductive fibers having one end fixed to the flexible substrate, electrical conduction in an in-plane direction is formed by contact between the conductive fibers, and the conductive fibers are vibrated by giving an electrical signal to the pair of electrodes to generate sound pressure or the conductive fibers are vibrated by receiving sound pressure to cause the pair of electrodes to output an electrical signal.

According to the invention, since the electrodes can be provided to the insulating dielectric film without interposing an insulating layer, and thickness can be reduced, three-dimensional deformation is possible and the drive voltage can be further reduced.

In the invention described above, when the sound pressure-electrical signal conversion device is deformed, the frequency characteristics are not substantially changed. According to the invention, since the electrodes are responsible for formation of sound pressure or conversion into an electrical signal, there is no change in the frequency characteristics due to deformation, and operational stability is excellent even against three-dimensional deformation.

In the invention described above, the dielectric film is a piezoelectric conversion film. According to the invention, it is not necessary to provide a bias voltage, and the drive voltage can be reduced.

In the invention described above, the conductive fibers are fibers in which a conductive film is provided on a surface of a needle-shaped body whose rigidity is controlled and a frequency band is controlled by the rigidity. According to the invention, it is possible to easily obtain a device suitable for an application.

DESCRIPTION OF EMBODIMENTS

Example 1

Hereinafter, a sound pressure-electrical signal conversion device 1 according to an example of the present invention will be described in detail with reference to FIGS. 1 to 3.

Figure 1:
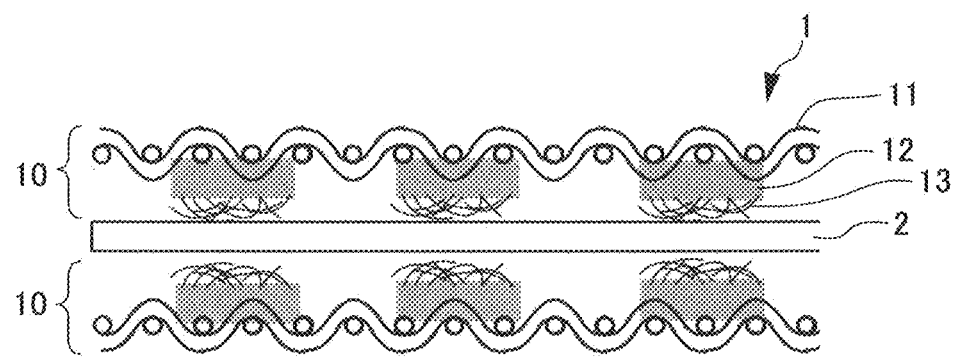
FIG. 1 is a cross-sectional view of a sound pressure-electrical signal conversion device according to an example of the present invention.

As illustrated in FIG. 1, the sound pressure-electrical signal conversion device 1 is a device in which a polymer sheet 2 is sandwiched between a pair of electrodes 10 spreading in a sheet shape and facing each other. The polymer sheet 2 is a dielectric film and insulates the electrodes 10 from each other. That is, it is not necessary to provide another insulating layer. As the polymer sheet 2, a dielectric film is used. That is, dielectric polarization is generated with respect to an external electric field while the electrodes 10 are electrically insulated from each other. In particular, the polymer sheet 2 is preferably thin in order of μm, and the polymer sheet 2 is made thin, whereby a distance between the electrodes 10 can be shortened and a drive voltage can be further reduced.

Additionally, the dielectric film is particularly preferably an electret film. The electret film is a dielectric as described above, traps negative charges in an internal negative charge layer, induces positive charges inversely proportional to a distance from the negative charge layer on both main surfaces, and charges the positive charges on the surfaces of the main surfaces. Additionally, the dielectric film may be a piezoelectric conversion film that has a discontinuous structure in a thickness direction by having pores or being formed of materials having different hardness and that also have a piezoelectric conversion effect.

As the electret film, for example, a fluorine-based polymer can be suitably used. Additionally, stretchability may be imparted to the electret film by using a porous fluorine-based polymer membrane or the like.

Figure 2:
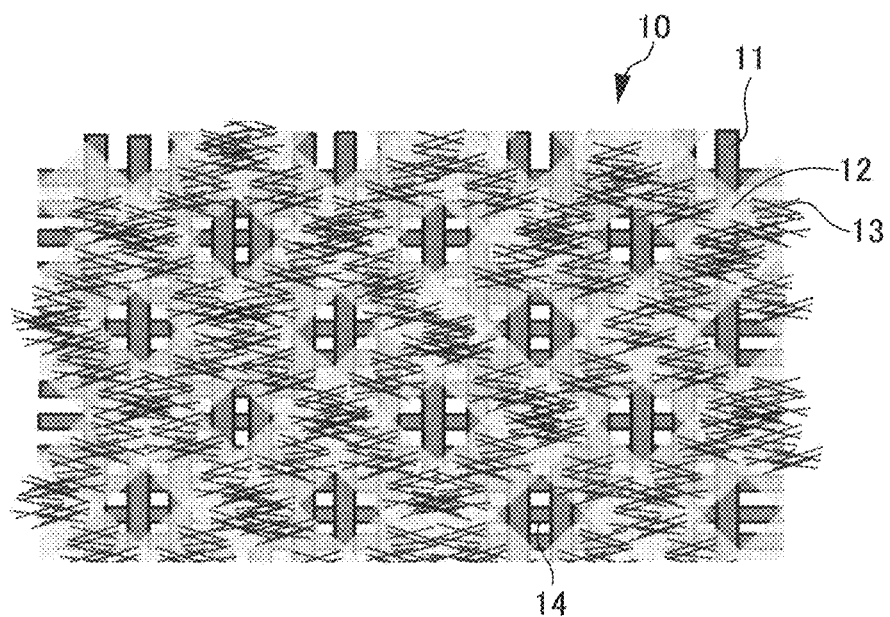
FIG. 2 is a plan view of one electrode of the sound pressure-electrical signal conversion device.

Referring also to FIG. 2, the electrode 10 includes an insulating flexible substrate 11 and conductive fibers 13 having one end fixed to the flexible substrate 11. For the flexible substrate 11, for example, a woven fabric or a fiber mesh can be used. Additionally, any other material may be used as long as the material is a sheet-shaped body having flexible and insulating properties and having a plurality of through-holes 14 penetrating both main surfaces, and for example, the material can be paper having a plurality of through-holes 14 or a resin sheet having a plurality of through-holes 14.

The conductive fibers 13 are, for example, fibers such as silver-plated fibers or carbon fibers that are conductive by contact between fibers. Additionally, in order to fix one end to the flexible substrate 11, it is also preferable to use short fibers. Here, fixing one end does not necessarily mean fixing only one end of both ends. It is sufficient if a part of the conductive fibers 13 is fixed to the flexible substrate 11 and a part of the conductive fibers 13 on a side of the polymer sheet 2 is fixed so as to be movable. Additionally, both the ends may be fixed so that an intermediate part of the conductive fibers 13 can be vibrated, and a metal mesh or the like can also be used. Furthermore, the conductive fibers 13 are arranged at a density so that the conductive fibers 13 comes in contact with each other to form electrical conduction in a direction along the inside of a plane on the flexible substrate 11.

A pressure sensitive adhesive 12 can be used to fix the conductive fibers 13 to the flexible substrate 11. As illustrated in the drawing, the pressure sensitive adhesive 12 is preferably arranged in a mesh shape so that at least a part of the through-hole 14 of the flexible substrate 11 is exposed. As the pressure sensitive adhesive 12, various pressure sensitive adhesives such as an acrylic pressure sensitive adhesive and a urethane pressure sensitive adhesive can be used. Note that other fixing methods such as fixing using an adhesive and fixing by embedment can also be used without using the pressure sensitive adhesive 12.

According to the sound pressure-electrical signal conversion device 1 as described above, an electrical signal is given to the electrodes 10, whereby the conductive fibers 13 can be vibrated to generate sound pressure. That is, the sound pressure-electrical signal conversion device 1 can be used as a speaker. Additionally, the conductive fibers 13 are vibrated by receiving the sound pressure, whereby the pair of electrodes 10 can be caused to output an electrical signal. That is, the sound pressure-electrical signal conversion device 1 can be used as a microphone.

Figure 3:
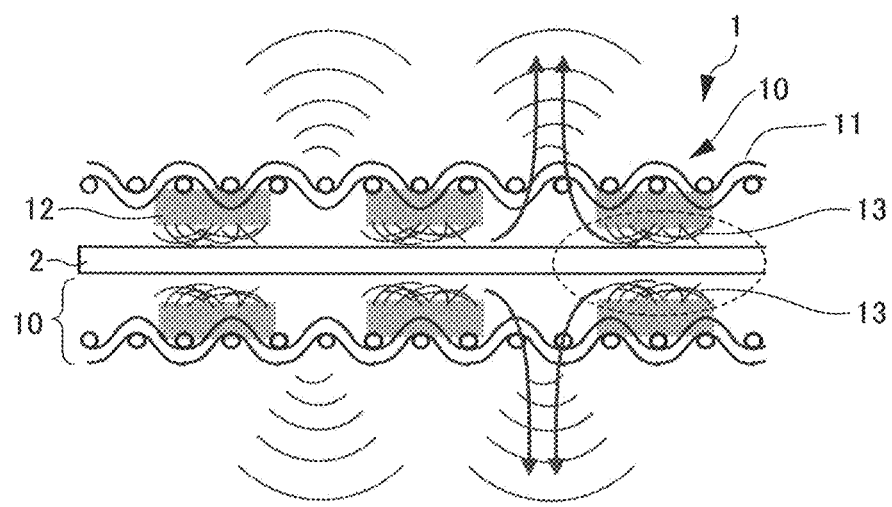
FIG. 3 is a cross-sectional view for describing a principle of the sound pressure-electrical signal conversion device.

In particular, as illustrated in FIG. 3, in a case where the sound pressure-electrical signal conversion device 1 is used as a speaker, when an electrical signal is input to the electrode 10, the conductive fibers 13 facing each other with the polymer sheet 2 that is the dielectric film interposed therebetween obtain an attractive force or a repulsive force and vibrate. Sound pressure generated by the vibration propagates to the outside of the electrode 10 through a plurality of holes of the pressure sensitive adhesive 12 arranged in a mesh shape and a plurality of holes penetrating both main surfaces of the flexible substrate 11 (see arrows). Note that the pressure sensitive adhesive 12 does not necessarily require a hole, and the sound pressure can be propagated even if the pressure sensitive adhesive 12 is passed through.

That is, in the sound pressure-electrical signal conversion device 1, the polymer sheet 2 sandwiched between the pair of electrodes 10 is not used as a diaphragm, but the conductive fibers 13 that are a part of the electrodes 10 are used as vibrators. Since a part of the conductive fibers 13 is fixed to the flexible substrate 11 and the other parts thereof are movable, the conductive fibers 13 individually function as vibrators and are responsible for forming sound pressure.

Additionally, while the electrodes 10 facing each other with the polymer sheet 2 interposed therebetween are insulated from each other, a distance between the electrodes 10 can be made close to the thickness of the polymer sheet 2. Accordingly, high sound pressure can be obtained even if the drive voltage is low. In particular, the conductive fibers 13 are preferably fixed to one main surface of the flexible substrate 11 and arranged so as to face the polymer sheet 2. This can bring the conductive fibers 13 in close proximity to the polymer sheet 2 and as a result, can bring the conductive fibers 13 in closest proximity to the electrodes 10 facing each other. As a result, the drive voltage can be further reduced.

Additionally, when the polymer sheet 2 is an electret film, charging such that a surface voltage is, for example, −200 V or more can be obtained, and it is not necessary to apply a bias voltage.

Furthermore, since the sound pressure-electrical signal conversion device 1 includes a flexible material, the sound pressure-electrical signal conversion device 1 can be three-dimensionally deformed, for example, bent or twisted. Additionally, the sound pressure-electrical signal conversion device 1 may include a stretchable material and be made stretchable. In addition, as described above, since the conductive fibers 13 are individually used as vibrators, even if the sound pressure-electrical signal conversion device 1 is three-dimensionally deformed, there is no change in a state in which each of the conductive fibers 13 is fixed to the flexible substrate 11, and frequency characteristics are not substantially changed. That is, the sound pressure-electrical signal conversion device 1 is excellent in operational stability against deformation.

Figure 4:
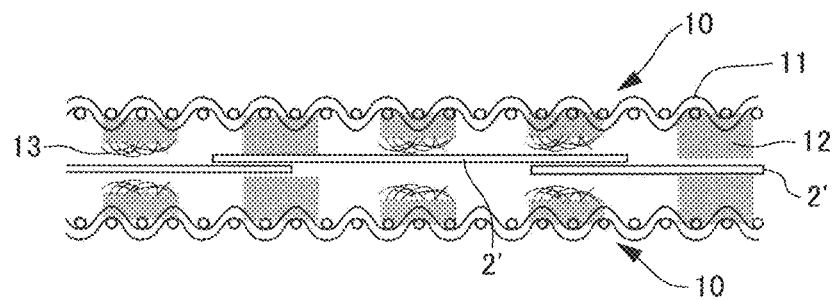
FIG. 4 is a cross-sectional view of a sound pressure-electrical signal conversion device illustrating another arrangement example of a polymer sheet.

Note that as illustrated in FIG. 4, even in a case where a polymer sheet 2' is obtained using a material having no stretchability, while a plurality of polymer sheets 2' is partially overlapped with each other and is made slidable, insulation between the electrodes 10 is maintained, whereby the sound pressure-electrical signal conversion device 1 can be made stretchable.

Additionally, even if the sound pressure-electrical signal conversion device 1 is used as a microphone, it is not necessary to apply a bias voltage for a reason similar to the reason described above, and a large electrical signal can be obtained even at low sound pressure. In this case, the conductive fibers 13 are responsible for converting sound pressure into an electrical signal.

Note that the conductive fibers 13 may be fibers in which a conductive film is provided on a surface of a needle-shaped body whose rigidity is controlled. A frequency band is controlled by the rigidity, whereby it is possible to easily obtain the sound pressure-electrical signal conversion device 1 having frequency characteristics suitable for an application.

Additionally, the conductive fibers 13 may be arranged on only one of the pair of electrodes 10. That is, the other electrode may include a thin film or the like. In this case, the conductive fibers 13 arranged on one electrode 10 are vibrated, whereby the sound pressure-electrical signal conversion device 1 can be used as a speaker or a microphone similar to the speaker or the microphone described above.

[Speaker Manufacturing Test]

Next, with reference to FIGS. 5 to 8, description will be given regarding a result of study on sound pressure characteristics and the like in a case where a plurality of sound pressure-electrical signal conversion devices 1 was actually manufactured and used as speakers.

Figure 5:
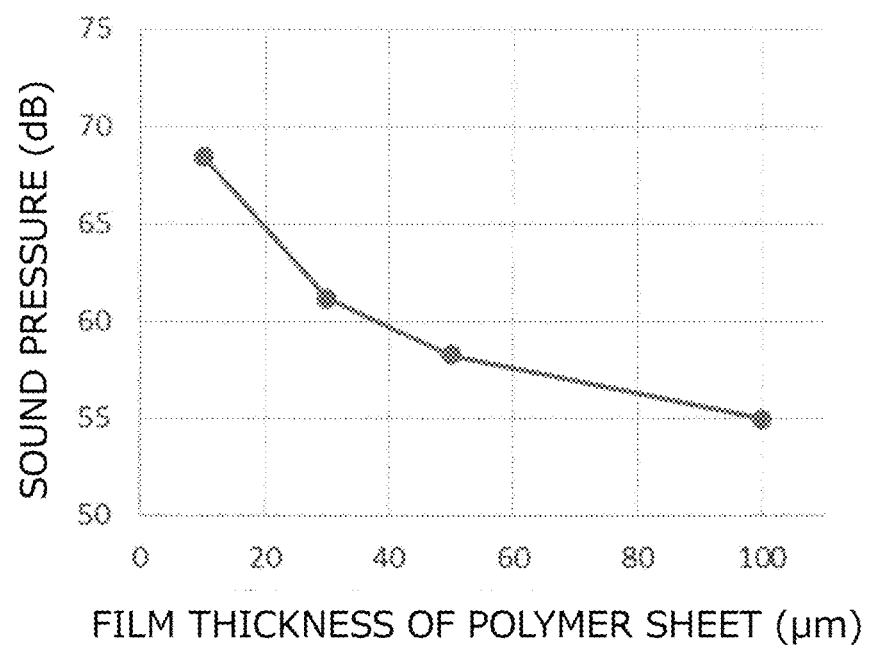
FIG. 5 is a graph illustrating a relationship between film thickness of the polymer sheet and sound pressure.

As illustrated in FIG. 5, when sound pressure was measured by changing the film thickness of the polymer sheet 2, it was found that in the case of the polymer sheet 2 having thinner film thickness, higher sound pressure is obtained. Additionally, it was also found that the thickness of the polymer sheet 2 is made thin to order of whereby high sound pressure is obtained, which is preferable. That is, it was reconfirmed that according to the sound pressure-electrical signal conversion device 1 described above, since the distance between the electrodes 10 can be shortened, high sound pressure can be obtained even at a low drive voltage.

Figure 6:
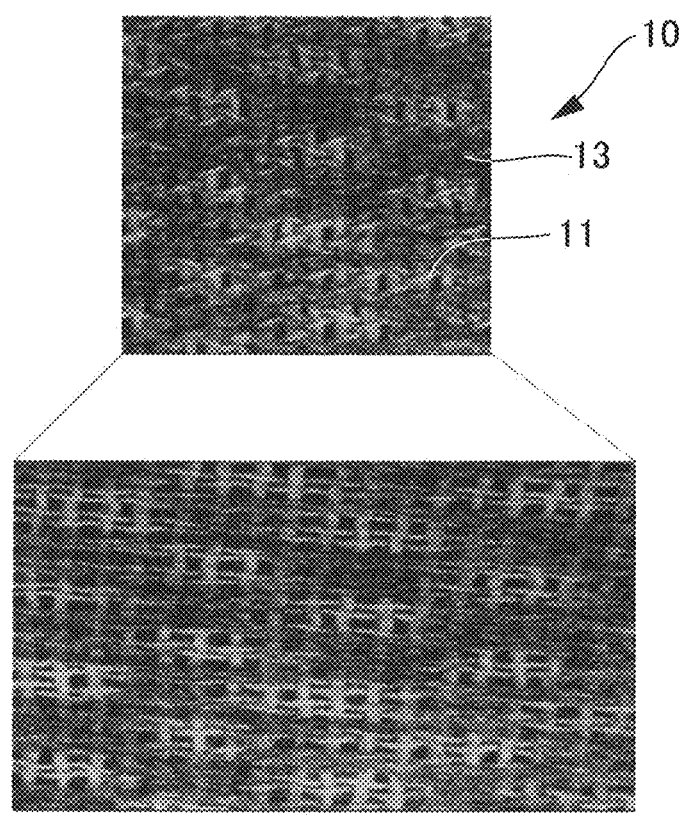
FIG. 6 is a comparative photograph of the electrode in a normal state and the electrode in an extended state.

FIG. 6 illustrates photographs of one electrode 10 as viewed from a face side to which the conductive fibers 13 are fixed. In particular, while the upper photograph illustrates the electrode 10 before being extended, the lower photograph illustrates the electrode 10 extended by tension being applied in the left-right direction of a paper surface. Additionally, positions of the left and right ends of each photograph before the extension corresponded to positions of the left and right ends of each photograph after the extension. In this example, an extension rate exceeded approximately 50% (150% in terms of length).

Figure 7:
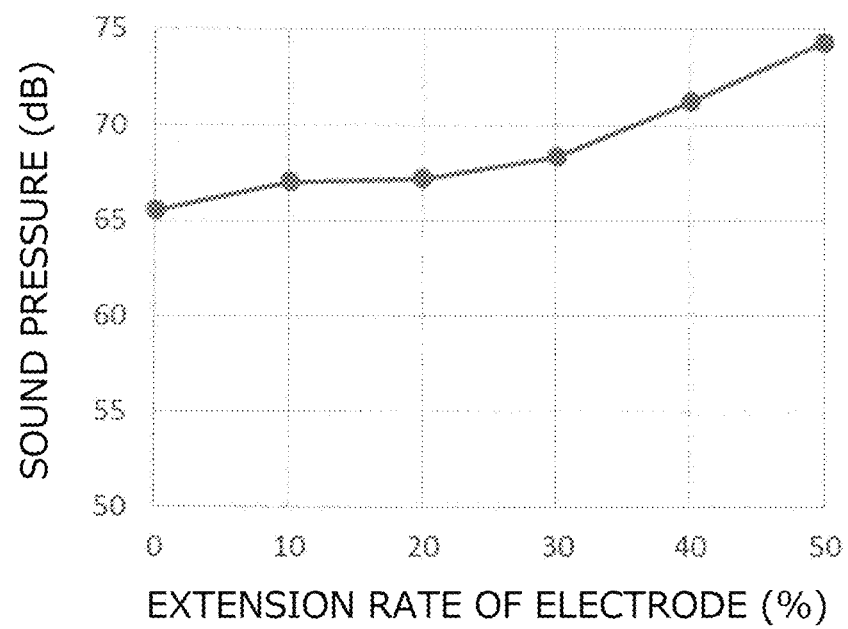
FIG. 7 is a graph illustrating a relationship between an extension rate and sound pressure of the sound pressure-electrical signal conversion device.

FIG. 7 illustrates changes in the sound pressure when the sound pressure-electrical signal conversion device 1 was extended, similarly to a case where the electrode 10 was extended as described above. As illustrated in the drawing, the larger the extension rate, the larger the sound pressure. This is considered to be because the opening of the through-hole 14 of the flexible substrate 11 of the electrode 10 was enlarged by the extension, and the propagation of the sound pressure to the outside of the electrode 10 was improved. Additionally, this is also considered to be because the thickness of the polymer sheet 2 was reduced by the extension and the distance between the electrodes 10 was shortened.

Figure 8:
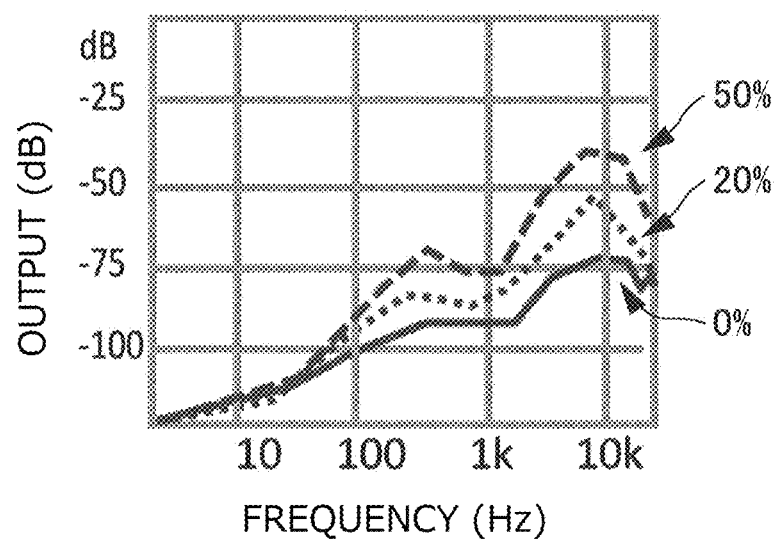
FIG. 8 is a graph illustrating a relationship between a frequency and sound pressure for each extension rate.

FIG. 8 illustrates a relationship (frequency characteristics) between a frequency and the sound pressure (output) for each extension rate. As the extension rate increased from 0% to 20% and further to 50%, the sound pressure increased, but no substantial change in frequency characteristics was observed.

Figure 9:
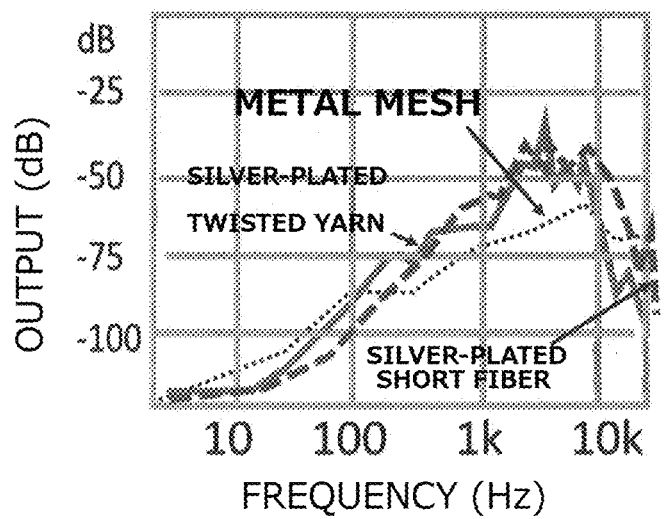
FIG. 9 is a graph illustrating a relationship between a frequency and sound pressure according to the type of conductive fibers.

FIG. 9 illustrates a relationship (frequency characteristics) between a frequency and sound pressure according to the type of the conductive fibers 13. For the conductive fibers 13, three types of a silver-plated short fiber, a silver-plated twisted yarn, and a metal mesh were used. Output in a low frequency and low-pitched sound range was the highest in the metal mesh, followed by the silver-plated twisted yarn and the silver-plated short fiber, in that order. There was a tendency that as the unit weight of the conductive fibers 13 was increased, output in the low-pitched sound range could be increased, and as the unit weight was decreased, output in a high-pitched sound range could be increased. That is, the frequency characteristics can also be adjusted by combining and arranging a plurality of types of the conductive fibers 13.

Example 2

Figure 11:
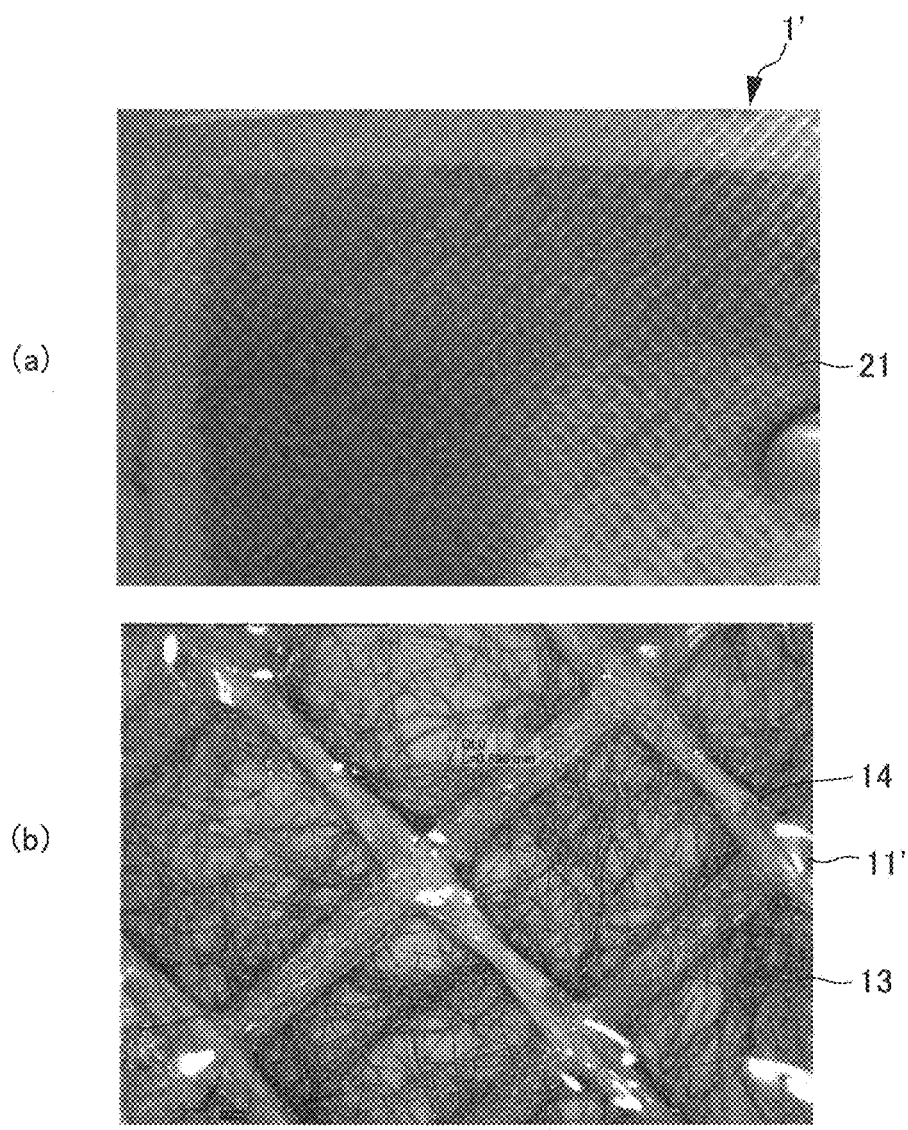
FIG. 11(*a*) is a photograph of appearance of the sound pressure-electrical signal conversion device according to the example, and FIG. 11(*b*) is an enlarged photograph of a main part thereof.
Figure 12:
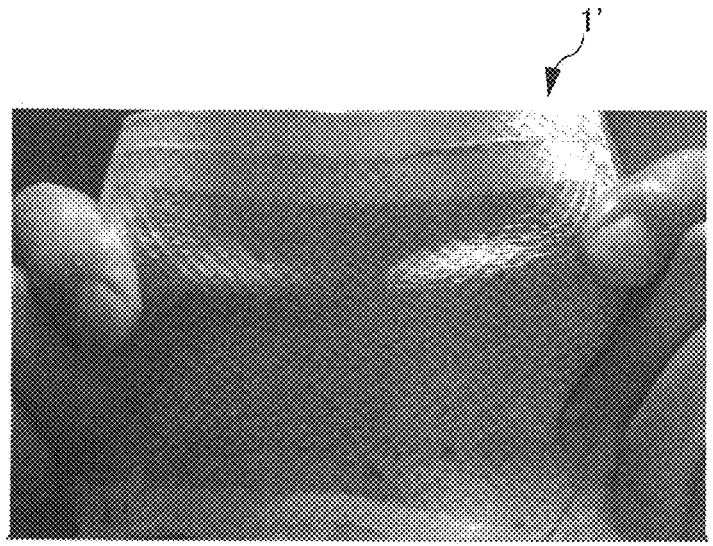
FIG. 12(*a*) is a photograph of appearance of the sound pressure-electrical signal conversion device according to the example when being extended, and FIG. 12(*b*) is an enlarged photograph thereof.
Figure 12:
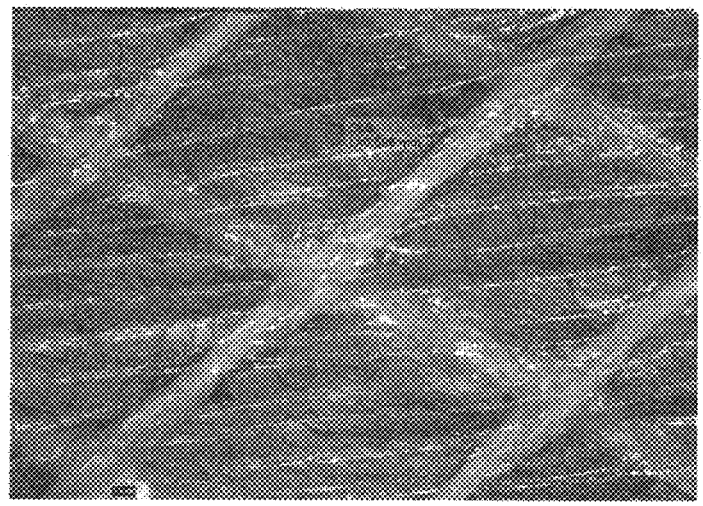

Next, a sound pressure-electrical signal conversion device 1' according to another example of the present invention will be described in detail with reference to FIGS. 10 to 12.

Figure 10:
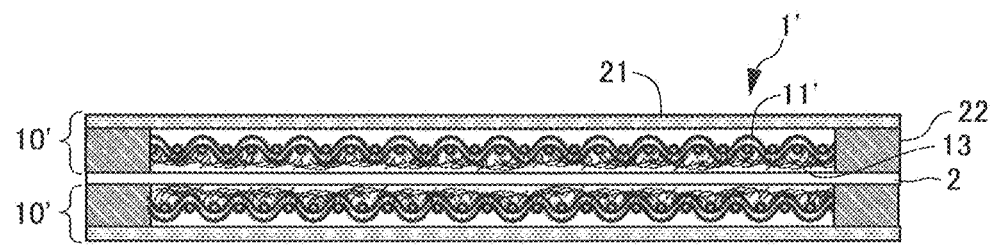
FIG. 10 is a cross-sectional view of a sound pressure-electrical signal conversion device according to another example.

As illustrated in FIG. 10, the sound pressure-electrical signal conversion device 1' is a device in which a polymer sheet 2 is sandwiched between a pair of electrodes 10' spreading in a sheet shape and facing each other, similarly to the sound pressure-electrical signal conversion device 1 described above. The polymer sheet 2 is a dielectric film and insulates the electrodes 10' from each other.

Here, the electrode 10' includes an insulating flexible substrate 11' and conductive fibers 13 having one end fixed to a flexible substrate 11'. The flexible substrate 11' is impregnated or coated with a pressure sensitive adhesive, and for example, a woven fabric or a fiber mesh can be used. Here, a glass fiber net coated with the pressure sensitive adhesive was used. Then, a part of the conductive fibers 13 is fixed to the flexible substrate 11' with the pressure sensitive adhesive, and the other parts thereof are movable. For example, a part of the conductive fibers 13 arranged in a through-hole 14 (see FIG. 11(b)) of the flexible substrate 11' is movable.

Additionally, the electrode 10' includes a sealing sheet 21 for sealing the flexible substrate 11' impregnated with the pressure sensitive adhesive against the outside, and a sealing adhesive body 22 for sealing an end of the sealing sheet 21. As the sealing sheet 21, for example, a resin film having a thickness of 10 to 30 μm is suitable, and a nonwoven fabric having a thickness of 500 μm or less and the like can also be suitably used. As the sealing sheet 21, a sealing sheet that can seal the pressure sensitive adhesive against the outside without inhibiting deformation required for the sound pressure-electrical signal conversion device 1' and that does not inhibit the propagation of sound pressure to the inside and outside is selected. The others are similar to Example 1.

That is, the pressure sensitive adhesive is applied to the flexible substrate 11', whereby it is no longer necessary to arrange the pressure sensitive adhesive alone in a mesh shape, and it is possible to save time and effort for manufacturing and improve the degree of freedom in terms of the type of the pressure sensitive adhesive that can be used. Additionally, the through-hole 14 of the flexible substrate 11' and a hole of the pressure sensitive adhesive are made to coincide with each other, and the through-hole 14 is not partially blocked by the pressure sensitive adhesive, which is advantageous for the propagation of the sound pressure. Furthermore, the holes of the pressure sensitive adhesive are made to follow in the deformation of the through-hole 14 due to the deformation of the sound pressure-electrical signal conversion device 1', and the mobility of the other parts of the conductive fibers 13, a part of which is fixed to the flexible substrate 11' can be secured.

FIG. 11(a) illustrates a photograph of appearance of the sound pressure-electrical signal conversion device 1' manufactured in this manner and FIG. 11(b) illustrates an enlarged photograph of the sound pressure-electrical signal conversion device 1' with the sealing sheet 21 removed. It was observed that a number of conductive fibers 13 was arranged in the through-hole 14 of the flexible substrate 11'.

FIG. 12(a) illustrates a photograph of appearance of the sound pressure-electrical signal conversion device 1' is extended in a direction along the main surface and FIG. 12(b) illustrates an enlarged photograph thereof. Even in a case where the sound pressure-electrical signal conversion device 1' was extended in this manner, no substantial change was observed in the frequency characteristics of the sound pressure-electrical signal conversion device 1'.

Although the examples according to the present invention and modifications based on the examples have been described above, the present invention is not necessarily limited thereto, and those skilled in the art will be able to find various alternative examples and modifications without departing from the gist of the present invention or the appended claims.

REFERENCE SIGNS LIST

1 Sound pressure-electrical signal conversion device
2 Polymer sheet
10 Electrode 11 Flexible substrate
12 Pressure sensitive adhesive
13 Conductive fibers
14 Through-hole

The invention claimed is:

1. A sound pressure-electrical signal conversion device including a polymer sheet sandwiched between a pair of electrodes facing each other, wherein:
the polymer sheet is an insulating dielectric film and insulates the pair of electrodes from each other,
at least one of the electrodes includes
an insulating flexible substrate having a plurality of through-holes and
a plurality of conductive fibers having a part fixed to the flexible substrate and a movable part, wherein electrical conduction in an in-plane direction is formed by contact between the conductive fibers,
the conductive fibers individually function as vibrators, and
the conductive fibers are vibrated by giving an electrical signal to the pair of electrodes to generate sound pressure, or the conductive fibers are vibrated by receiving sound pressure to cause the pair of electrodes to output an electrical signal.

2. The sound pressure-electrical signal conversion device according to claim 1, wherein when the sound pressure-electrical signal conversion device is deformed, there is no change in a state in which each of the conductive fibers is fixed to the flexible substrate.

3. The sound pressure-electrical signal conversion device according to claim 2, wherein the dielectric film is a piezoelectric conversion film.

4. The sound pressure-electrical signal conversion device according to claim 2, wherein the conductive fibers are provided to one main surface of the flexible substrate and positioned to face the polymer sheet.

5. The sound pressure-electrical signal conversion device according to claim 2, wherein the flexible substrate has stretchability.

6. The sound pressure-electrical signal conversion device according to claim 2, wherein the flexible substrate includes a woven fabric, a fiber mesh, paper provided with the through-holes, or a resin sheet provided with the through-holes.

7. The sound pressure-electrical signal conversion device according to claim 2, wherein the conductive fibers are fibers in which a conductive film is provided on a surface of a needle-shaped body whose rigidity is controlled.

8. The sound pressure-electrical signal conversion device according to claim 2, wherein the conductive fibers have an average length shorter than an average opening width of the through-hole.

9. A sound pressure-electrical signal conversion method using a sound pressure-electrical signal conversion device including a polymer sheet sandwiched between a pair of electrodes facing each other, wherein:
the polymer sheet is an insulating dielectric film and insulates the pair of electrodes from each other,
at least one of the electrodes includes an insulating flexible substrate having a plurality of through-holes and a plurality of conductive fibers having a part fixed to the flexible substrate and a movable part, wherein electrical conduction in an in-plane direction is formed by contact between the conductive fibers,
the conductive fibers individually function as vibrators, and
the conductive fibers are vibrated by giving an electrical signal to the pair of electrodes to generate sound pressure, or the conductive fibers are vibrated by receiving sound pressure to cause the pair of electrodes to output an electrical signal.

10. The sound pressure-electrical signal conversion method according to claim 9, wherein when the sound pressure-electrical signal conversion device is deformed, there is no change in a state in which each of the conductive fibers is fixed to the flexible substrate.

11. The sound pressure-electrical signal conversion method according to claim 10, wherein the dielectric film is a piezoelectric conversion film.

12. The sound pressure-electrical signal conversion method according to claim 10, wherein the conductive fibers are fibers in which a conductive film is provided on a surface of a needle-shaped body whose rigidity is controlled and a frequency band is controlled by the rigidity.

* * * * *